United States Patent
Nakamoto

(10) Patent No.: US 10,659,074 B2
(45) Date of Patent: May 19, 2020

(54) DELTA-SIGMA MODULATOR, ELECTRONIC DEVICE, AND METHOD FOR CONTROLLING DELTA-SIGMA MODULATOR

(71) Applicant: SONY SEMICONDUCTOR SOLUTIONS CORPORATION, Kanagawa (JP)

(72) Inventor: Eiichi Nakamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/337,201

(22) PCT Filed: Sep. 1, 2017

(86) PCT No.: PCT/JP2017/031532
§ 371 (c)(1),
(2) Date: Mar. 27, 2019

(87) PCT Pub. No.: WO2018/109992
PCT Pub. Date: Jun. 21, 2018

(65) Prior Publication Data
US 2019/0296763 A1 Sep. 26, 2019

(30) Foreign Application Priority Data

Dec. 14, 2016 (JP) .................................. 2016-242181

(51) Int. Cl.
*H03M 3/00* (2006.01)
*H03M 3/02* (2006.01)
*H04R 3/00* (2006.01)

(52) U.S. Cl.
CPC ............. *H03M 3/332* (2013.01); *H03M 3/02* (2013.01); *H03M 3/416* (2013.01); *H03M 3/464* (2013.01); *H04R 3/00* (2013.01)

(58) Field of Classification Search
CPC ...... H03M 3/332; H03M 3/416; H03M 3/464; H04R 3/00
(Continued)

(56) References Cited

U.S. PATENT DOCUMENTS 5,010,347 A    4/1991  Yukawa
5,818,376 A *  10/1998 Bianchessi .......... H03M 7/3008
                                                  341/143

(Continued)

FOREIGN PATENT DOCUMENTS

EP    0308982 A2   3/1989
JP    64-84920 A   3/1989
(Continued)

OTHER PUBLICATIONS

Zhou, et al., "A Spur-Reduction Delta-Sigma Modulator with Efficient Dithering for Fractional Frequency Synthesize", 2016 IEEE, pp. 1473-1476.

(Continued)

*Primary Examiner* — Khai M Nguyen
(74) *Attorney, Agent, or Firm* — Chip Law Group

(57) ABSTRACT

To effectively suppress an idle tone in a delta-sigma modulator that generates a feedback signal by a digital-to-analog converter. A filter integrates a difference between an input analog signal and a feedback signal, and outputs the integrated difference as an integrated signal. A preceding-stage quantizer quantizes an integrated signal into a digital signal, and outputs the resulting digital signal as a preceding-stage output signal. An adder adds a predetermined dithering signal to a preceding-stage output signal, and outputs the (Continued)

resulting signal as a subsequent-stage input signal. A subsequent-stage quantizer configured to quantize the subsequent-stage input signal into a digital signal of a shorter number of bits than a preceding-stage output signal, and outputs the resulting digital signal as a subsequent-stage output signal. A digital-to-analog converter configured to convert a subsequent-stage output signal into an analog signal, and outputs the resulting analog signal to a filter as a feedback signal.

8 Claims, 10 Drawing Sheets

(58) Field of Classification Search
USPC .......................................... 341/131, 143, 155
See application file for complete search history.

(56) References Cited

U.S. PATENT DOCUMENTS

| | | | | |
|---|---|---|---|---|
| 6,313,774 | B1* | 11/2001 | Zarubinsky | H03M 3/412 341/143 |
| 6,404,368 | B1* | 6/2002 | Yamaguchi | H03M 3/412 341/143 |
| 9,419,643 | B2* | 8/2016 | Watanabe | H03M 3/464 |
| 9,490,835 | B2* | 11/2016 | Wang | H03M 3/37 |
| 2002/0057214 | A1 | 5/2002 | Brooks | |
| 2003/0174080 | A1 | 9/2003 | Brooks | |
| 2004/0233084 | A1 | 11/2004 | Brooks | |
| 2005/0128111 | A1 | 6/2005 | Brooks | |

FOREIGN PATENT DOCUMENTS

| | | |
|---|---|---|
| JP | 64-084920 A | 3/1989 |
| JP | 2016-100871 | 5/2016 |
| WO | 02/23731 A2 | 3/2002 |

OTHER PUBLICATIONS

Gonzalez-Diaz, "Efficient Dithering in MASH Sigma-Delta Modulators for Fractional Frequency Synthesizers", IEEE Transactions on Circuits and Systems, vol. 57, No. 9, Sep. 2010, pp. 2394-2403.

International Search Report and Written Opinion of PCT Application No. PCT/JP2017/031532, dated Nov. 21, 2017, 09 pages of ISRWO.

Gonzalez-Diaz, et al., "Efficient Dithering in MASH Sigma-Delta Modulators for Fractional Frequency Synthesizers", IEEE Transactions on Circuits and System, vol. 57, No. 9, Sep. 2010, 2394-2403 pages.

Zhou, et al., "A Spur-Reduction Delta-Sigma Modulator with Efficient Dithering for Fractional Frequency Synthesizer", 2016 IEEE, 1473-1476 pages.

* cited by examiner

FIG. 11

| INPUT SIGNAL<br>($b_{in0}$, $b_{in1}$, $b_{in2}$) | DITHERING<br>SIGNAL (3 bits) |
|---|---|
| 111 | −1 |
| 110 | −2 |
| 101 | +1 |
| 100 | 0 |
| 011 | −1 |
| 010 | +2 |
| 001 | +1 |
| 000 | 0 |

DELTA-SIGMA MODULATOR, ELECTRONIC DEVICE, AND METHOD FOR CONTROLLING DELTA-SIGMA MODULATOR

CROSS REFERENCE TO RELATED APPLICATIONS

This application is a U.S. National Phase of International Patent Application No. PCT/JP2017/031532 filed on Sep. 1, 2017, which claims priority benefit of Japanese Patent Application No. JP 2016-242181 filed in the Japan Patent Office on Dec. 14, 2016. Each of the above-referenced applications is hereby incorporated herein by reference in its entirety.

TECHNICAL FIELD

The present technology relates to a delta-sigma modulator, an electronic device, and a method for controlling a delta-sigma modulator. Specifically, the present technology relates to a delta-sigma modulator that generates a feedback signal by a digital-to-analog converter, an electronic device, and a method for controlling a delta-sigma modulator.

BACKGROUND ART

Conventionally, in various electronic devices that take in and process analog signals, an analog to digital converter (ADC) has been used to convert an analog signal into a digital signal. This ADC can be classified into various types such as a sequential comparison-type ADC, a pipeline-type ADC, and a delta-sigma modulator. Among these types, a delta-sigma modulator is often used in the fields of audio, measurement, and the like, for reasons such as the structure being simple and quantization noise being easy to reduce.

In general, when a direct-current component of a certain level is input to a delta-sigma modulator, an unnecessary periodic signal called idle tone is output in some cases. This idle tone causes a signal to noise (SN) ratio and total harmonic distortion+noise characteristics to deteriorate. Hence, a delta-sigma modulator has been proposed in which, in a circuit including a preceding-stage integrator and quantizer and a subsequent-stage integrator and quantizer, an adder that applies a dithering signal is disposed between the integrators (e.g., see Patent Literature 1).

CITATION LIST

Patent Literature

Patent Literature 1: JP 2016-100871A

DISCLOSURE OF INVENTION

Technical Problem

In the above-described conventional technology, the idle tone can be suppressed to some extent by application of the dithering signal. However, integration is interposed between the above-described delta-sigma modulator and an input of the subsequent-stage quantizer; thus, an ideal dithering signal is not obtained. This causes a problem in that an effect of suppressing an idle tone is limited.

The present technology has been made in view of such circumstances, and aims to effectively suppress an idle tone in a delta-sigma modulator that generates a feedback signal by a digital-to-analog converter.

Solution to Problem

The present technology has been made to overcome the aforementioned problem, and a first aspect of the present technology is a delta-sigma modulator including: a filter configured to integrate a difference between an input analog signal and a feedback signal, and output the integrated difference as an integrated signal; a preceding-stage quantizer configured to quantize the integrated signal into a digital signal, and output the resulting digital signal as a preceding-stage output signal; an adder configured to add a predetermined dithering signal to the preceding-stage output signal, and output the resulting signal as a subsequent-stage input signal; a subsequent-stage quantizer configured to quantize the subsequent-stage input signal into a digital signal of a shorter number of bits than the preceding-stage output signal, and output the resulting digital signal as a subsequent-stage output signal; and a digital-to-analog converter configured to convert the subsequent-stage output signal into an analog signal, and output the resulting analog signal to the filter as the feedback signal, and a method for controlling the same. This produces the following effect: a subsequent-stage output signal of a shorter number of bits than a preceding-stage output signal is input to the digital-to-analog converter.

Moreover, according to the first aspect, a dithering signal generation circuit configured to generate the predetermined dithering signal and supply the predetermined dithering signal to the adder may further be included. This produces the following effect: a dithering signal is generated in the delta-sigma modulator.

Moreover, according to the first aspect, the dithering signal generation circuit may include a linear shift feedback register configured to generate a predetermined code indicating a random number, and a logic circuit configured to generate the predetermined dithering signal from the predetermined code. This produces the following effect: a dithering signal is generated from a code indicating a random number.

Moreover, according to the first aspect, the predetermined dithering signal generation circuit may generate a signal whose expected value is substantially zero as the predetermined dithering signal.

This produces the following effect: a dithering signal whose expected value is substantially zero is applied.

Moreover, according to the first aspect, the filter may include a subtractor configured to compute a difference between the analog signal and the feedback signal, and an integrator configured to integrate the difference, and output the integrated difference as the integrated signal. This produces the following effect: a signal obtained by integrating a difference is output.

Moreover, a second aspect of the present technology is an electronic device including: a filter configured to integrate a difference between an input analog signal and a feedback signal, and output the integrated difference as an integrated signal; a preceding-stage quantizer configured to quantize the integrated signal into a digital signal, and output the resulting digital signal as a preceding-stage output signal; an adder configured to add a predetermined dithering signal to the preceding-stage output signal, and output the resulting signal as a subsequent-stage input signal; a subsequent-stage quantizer configured to quantize the subsequent-stage input signal into a digital signal of a shorter number of bits than the preceding-stage output signal, and output the resulting digital signal as a subsequent-stage output signal; a digital-to-analog converter configured to convert the subsequent-stage output signal into an analog signal, and output the resulting analog signal to the filter as the feedback signal; and a digital signal processing unit configured to execute predetermined processing on the subsequent-stage output signal. This produces the following effect: predetermined processing is executed on a subsequent-stage output signal of a shorter number of bits than a preceding-stage output signal.

Advantageous Effects of Invention

According to the present technology, the following advantageous effect can be achieved: an idle tone can be effectively suppressed in a delta-sigma modulator that generates a feedback signal by a digital-to-analog converter. Note that the effects described here are not necessarily limitative, and there may be achieved any one of the effects described in the present disclosure.

BRIEF DESCRIPTION OF DRAWINGS

FIG. 11 illustrates an example of mapping in the second embodiment of the present technology.

MODE(S) FOR CARRYING OUT THE INVENTION

Modes for carrying out the present technology (hereinafter referred to as embodiments) are described below. Description will be given in the following order.

1. First embodiment (example of re-quantizing signal to which dithering signal is applied)
2. Second embodiment (example of re-quantizing signal to which dithering signal whose expected value is substantially zero is applied)

1. First Embodiment

[Configuration Example of Sound Device]

Figure 1:
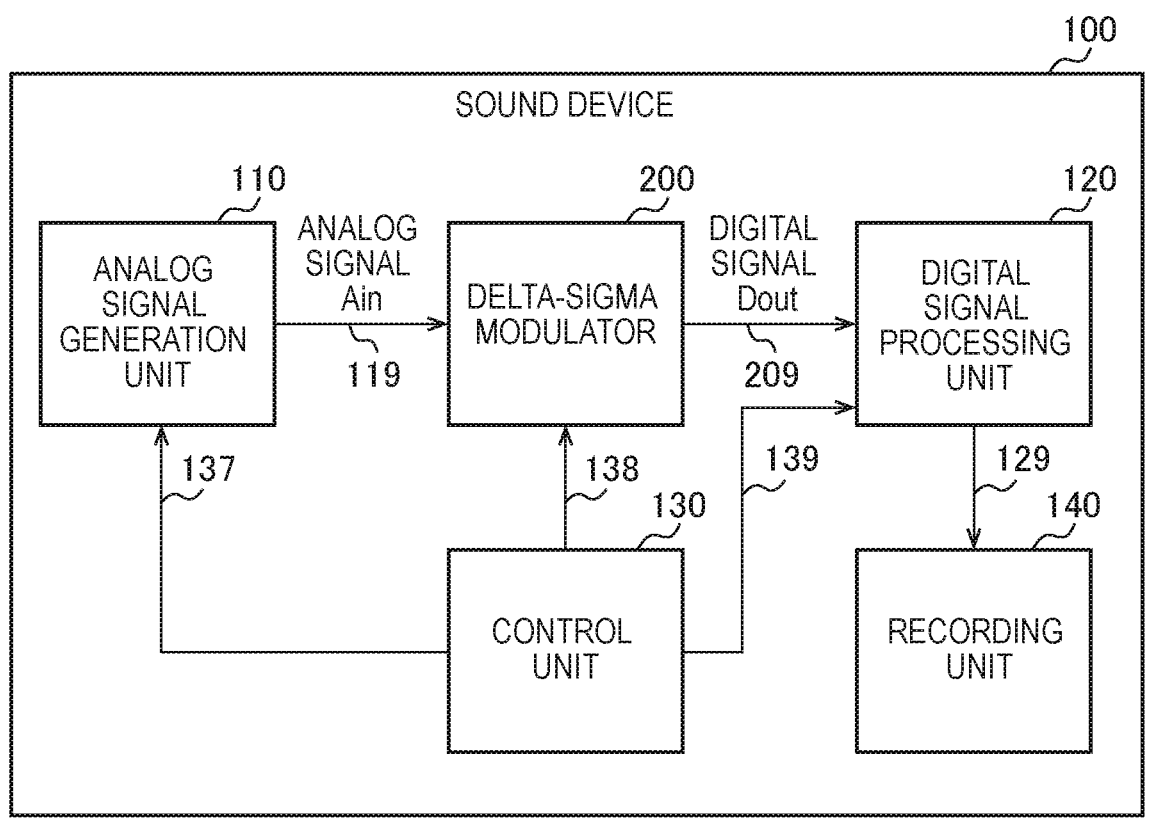
FIG. 1 is a block diagram illustrating a configuration example of a sound device in a first embodiment of the present technology.

FIG. 1 is a block diagram illustrating a configuration example of a sound device 100 in a first embodiment of the present technology. This sound device 100 is an electronic device that records audio signals, and includes an analog signal generation unit 110, a delta-sigma modulator 200, a digital signal processing unit 120, a control unit 130, and a recording unit 140. Note that the sound device 100 is an example of an electronic device described in the claims.

The analog signal generation unit 110 generates an analog signal Ain. As the analog signal generation unit 110, for example, a microphone that converts sound into analog electrical signals is assumed. This analog signal generation unit 110 supplies the generated analog signal Ain to the delta-sigma modulator 200 via a signal line 119.

The control unit 130 controls the entire sound device 100. This control unit 130 transmits control signals to the analog signal generation unit 110, the delta-sigma modulator 200, and the digital signal processing unit 120, respectively, via signal lines 137, 138, and 139. For example, in the case where an operation for starting recording is performed by a user, the control unit 130 controls the analog signal generation unit 110, the delta-sigma modulator 200, and the digital signal processing unit 120 by control signals to start operation. In addition, for example, in the case where an operation for ending recording is performed by the user, the control unit 130 controls the analog signal generation unit 110, the delta-sigma modulator 200, and the digital signal processing unit 120 to stop their operation.

The delta-sigma modulator 200 converts the analog signal Ain into a digital signal Dout. This delta-sigma modulator 200 supplies the digital signal Dout to the digital signal processing unit 120 via a signal line 209. An AD converter other than a delta-sigma modulator normally causes quantization noise to be distributed uniformly in all frequency bands, but a delta-sigma modulator causes quantization noise in a high frequency band to be relatively large and quantization noise in a low frequency band to be relatively small. Such an effect is called noise shaping.

The digital signal processing unit 120 executes predetermined signal processing on the digital signal Dout. This digital signal processing unit 120 performs, for example, signal processing of allowing a component of a frequency band lower than a predetermined cut-off frequency to pass by a low-pass filter. This signal processing removes quantization noise distributed in a high frequency band. In addition to this, compression processing of compressing data, format conversion processing, and the like are executed as needed, the digital signal processing unit 120 supplies the processed signal, as audio data, to the recording unit 140 via a signal line 129. The recording unit 140 records audio data.

Note that the delta-sigma modulator 200 is provided in the sound device 100; however, the delta-sigma modulator 200 may be provided in a device or equipment other than the sound device 100 (an information processing device, a transceiver, etc.), as long as the device takes in and processes analog signals.

[Configuration Example of Delta-Sigma Modulator]

Figure 2:
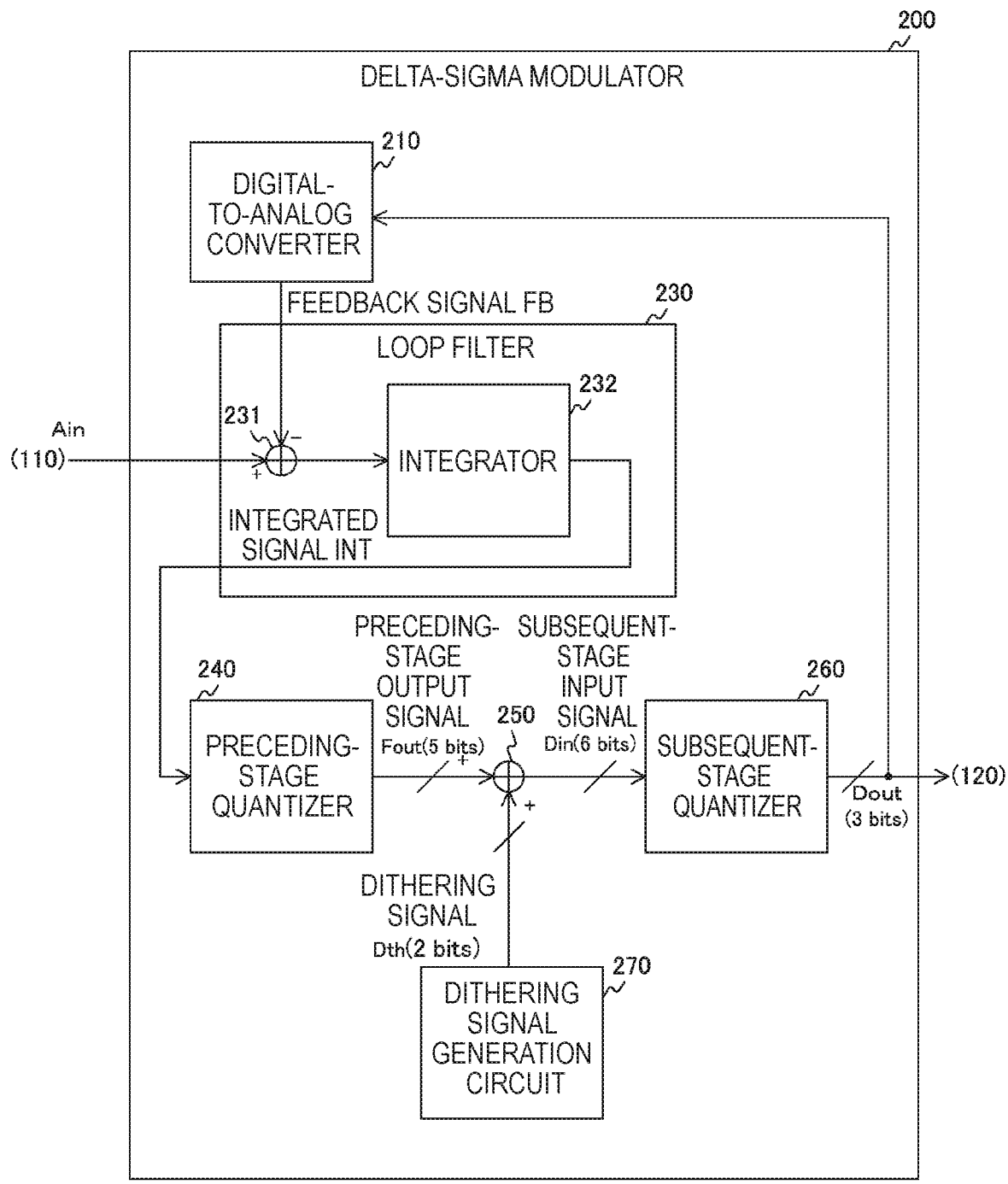
FIG. 2 is a block diagram illustrating a configuration example of a delta-sigma modulator in the first embodiment of the present technology.

FIG. 2 is a block diagram illustrating a configuration example of the delta-sigma modulator 200 in the first embodiment of the present technology. This delta-sigma modulator 200 includes a digital-to-analog converter 210, a loop filter 230, a preceding-stage quantizer 240, an adder 250, a subsequent-stage quantizer 260, and a dithering signal generation circuit 270. In addition, the loop filter 230 includes a subtractor 231 and an integrator 232.

The subtractor 231 computes a difference between the analog signal Ain and a feedback signal FB from the digital-to-analog converter 210, and supplies the difference to the integrator 232. The integrator 232 integrates the difference, and outputs an analog integrated signal INT indicating the integrated value to the preceding-stage quantizer 240. Note that the loop filter 230 is an example of a filter described in the claims.

The preceding-stage quantizer 240 quantizes the integrated signal INT into an M (M is an integer of 2 or more)-bit digital signal. This preceding-stage quantizer 240 outputs the generated digital signal to the adder 250 as a preceding-stage output signal Fout.

The dithering signal generation circuit 270 generates a D (D is an integer of less than M)-bit dithering signal Dth, and outputs the dithering signal Dth to the adder 250.

The adder 250 adds the dithering signal Dth to the preceding-stage output signal Fout, and outputs the resulting signal to the subsequent-stage quantizer 260 as a subsequent-stage input signal Din.

The subsequent-stage quantizer 260 re-quantizes the subsequent-stage input signal Din into an N (N is an integer of less than M)-bit digital signal Dout. For example, re-quantization is performed by truncation of a predetermined digit. The subsequent-stage quantizer 260 outputs the generated digital signal Dout to the digital-to-analog converter 210 and the digital signal processing unit 120. Note that the digital signal Dout is an example of a subsequent-stage output signal described in the claims.

For example, in the case where "5" is set in M and "2" is set in D, data size of the subsequent-stage input signal Din is "6" bits. In addition, in this case, an integer value of "−2" to "+1", for example, is set in the dithering signal Dth, and "3", for example, is set in N as a value less than M ("5"). The subsequent-stage quantizer 260, for example, clamps 6 bits to a range of 5 bits and then truncates lower 2 bits for re-quantization into 3 bits. That is, the fourth digit to the second digit of an input subsequent-stage input signal Din are output as Dout after re-quantization.

A 2-bit dithering signal Dth seems to have no influence on an output because it is applied to lower bits truncated by the subsequent-stage quantizer 260. However, application of the dithering signal Dth results in carry of digit to the least significant bit remaining without being truncated in the digital signal Dout; thus, high-precision information of the preceding-stage quantizer 240 can be truncated in a time-average manner and communicated to a subsequent stage.

The digital-to-analog converter 210 converts the digital signal Dout into an analog feedback signal FB, and outputs the feedback signal FB to the loop filter 230. As this digital-to-analog converter 210, for example, a switched capacitor or a current source digital to analog converter (DAC) is used.

Note that the dithering signal generation circuit 270 is disposed in the delta-sigma modulator 200, but the dithering signal generation circuit 270 may be disposed outside the delta-sigma modulator 200.

In addition, the digital-to-analog converter 210 converts a 3-bit digital signal Dout, but can also convert a digital signal Dout of the number of bits other than 3 bits.

In the digital-to-analog converter 210, as the number of bits of the digital signal Dout to be converted becomes longer, the number of elements, such as capacitors and switching elements, increases and a circuit size of the digital-to-analog converter 210 becomes larger. In addition, when the number of elements increases, product variance of the elements causes characteristics such as DA conversion precision to deteriorate. On the other hand, as the number of bits of the digital signal Dout becomes shorter, resolution of the delta-sigma modulator 200 becomes lower and an SN ratio becomes smaller. The number of bits N of the digital signal Dout is decided in consideration of a circuit size and characteristics of the digital-to-analog converter 210, and resolution and an SN ratio.

[Configuration Example of Dithering Signal Generation Circuit]

Figure 3:
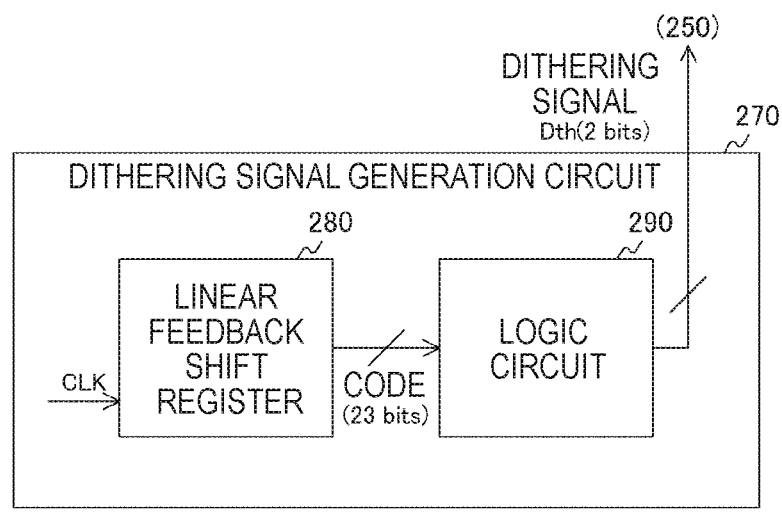
FIG. 3 is a block diagram illustrating a configuration example of a dithering signal generation circuit in the first embodiment of the present technology.

FIG. 3 is a block diagram illustrating a configuration example of the dithering signal generation circuit 270 in the first embodiment of the present technology. This dithering signal generation circuit 270 includes a linear feedback shift register 280 and a logic circuit 290.

The linear feedback shift register 280 generates a code of a predetermined size (e.g., 23 bits) indicating a random number, in synchronization with a predetermined clock signal CLK. This linear feedback shift register 280 supplies the generated code to the logic circuit 290.

The logic circuit 290 performs predetermined logical operation on the code to generate a D (e.g., 2)-bit dithering signal Dth. This logic circuit 290 supplies the generated dithering signal Dth to the adder 250.

[Configuration Example of Linear Feedback Shift Register]

Figure 4:
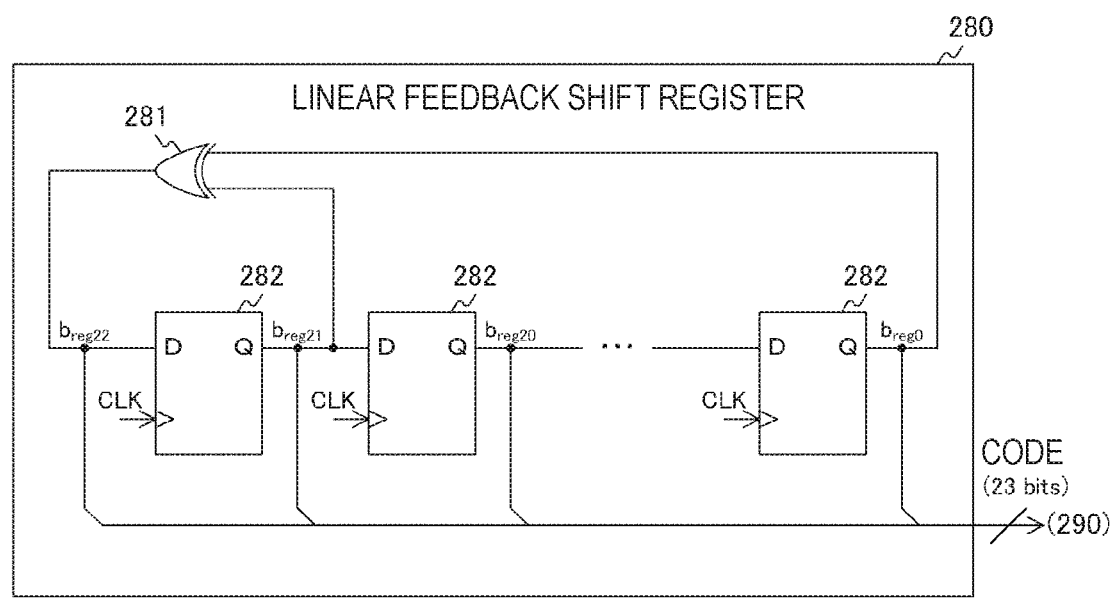
FIG. 4 is a circuit diagram illustrating a configuration example of a linear feedback shift register in the first embodiment of the present technology.

FIG. 4 is a circuit diagram illustrating a configuration example of the linear feedback shift register 280 in the first embodiment of the present technology. This linear feedback shift register 280 includes flip-flops 282 of the number of stages (e.g., 22 stages) corresponding to the number of bits of the code, and an exclusive OR (XOR) gate 281.

The flip-flop 282 holds an input bit in synchronization with the clock signal CLK. The flip-flop 282 of the S (S is an integer of "1" to "21")-th stage outputs the held bit to an input terminal of the flip-flop of the S+1-th stage. In addition, the bit output from the flip-flop 282 of the S-th stage is supplied to the logic circuit 290 as a (22−S)-th bit $b_{reg(22-s)}$ in the code.

The XOR gate 281 supplies the exclusive OR of a bit $b_{reg0}$ and a bit $b_{reg21}$, as a bit $b_{reg22}$, to an input terminal of the flip-flop 282 of the first stage and the logic circuit 290.

The above-described configuration produces a code of a pseudorandom number whose value changes periodically. For example, in the 22-stage linear feedback shift register 280, a pseudorandom number of the same value appears every 4 million cycles, where 1 cycle is a period of the clock signal CLK.

Figure 5:
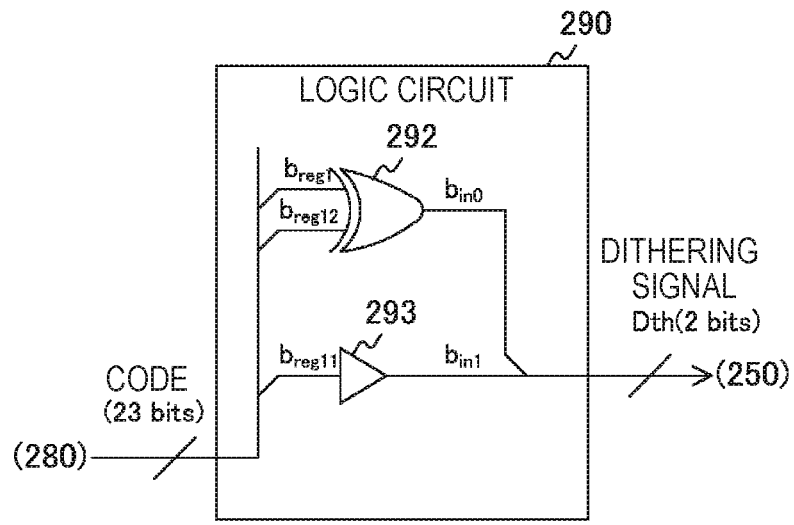
FIG. 5 is a circuit diagram illustrating a configuration example of a logic circuit in the first embodiment of the present technology.

FIG. 5 is a circuit diagram illustrating a configuration example of the logic circuit 290 in the first embodiment of the present technology. This logic circuit 290 includes a XOR gate 292 and a buffer 293.

The XOR gate 292 outputs the exclusive OR of $b_{reg1}$ and $b_{reg12}$ in the code as $b_{in0}$.

The buffer 293 outputs $b_{reg11}$ in the code as $b_{in1}$. As values of a signal including $b_{in0}$ and $b_{in1}$, uncorrelated random numbers of about 2 million cycles are obtained in a period of the 23-bit code (about 4 million cycles).

The signal including $b_{in0}$ and $b_{in1}$ is supplied to the adder 250 as the dithering signal Dth. A value of this signal is a value expressing "−2" to "+1" by two's-complement number.

Figure 6:
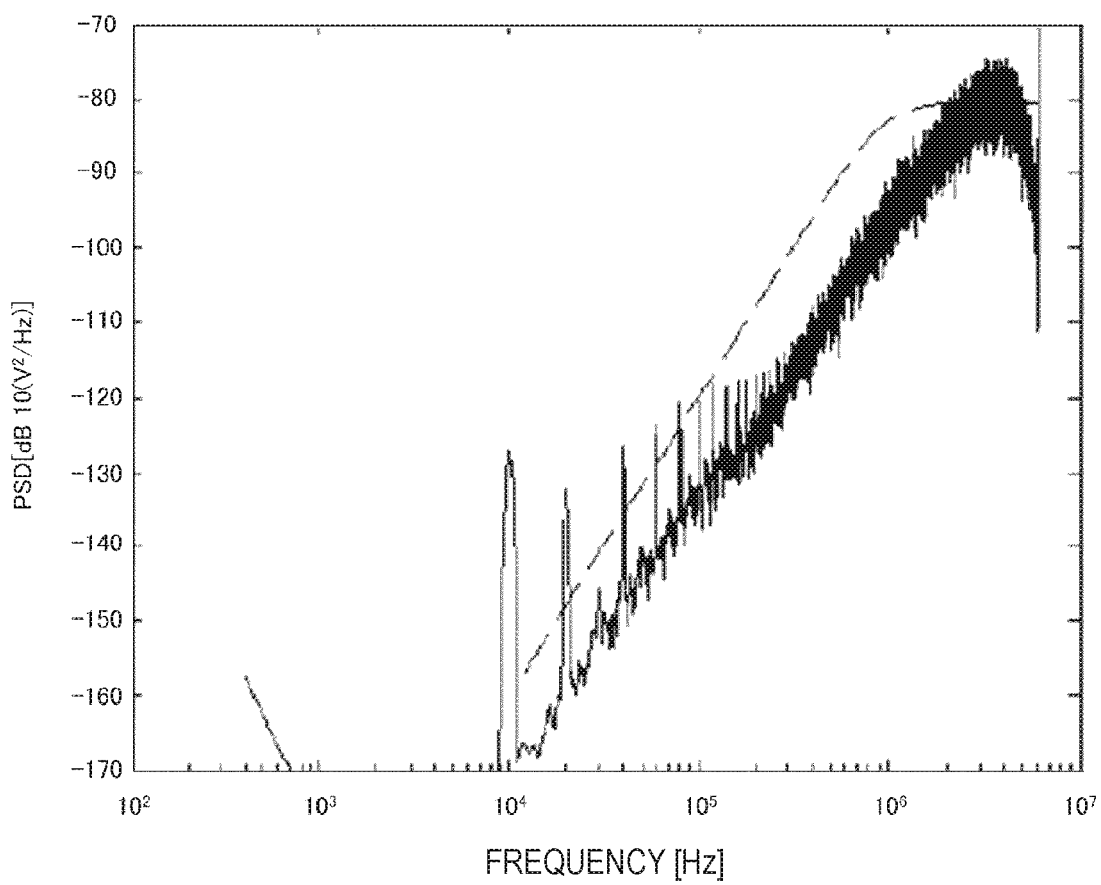
FIG. 6 is a graph illustrating an example of frequency characteristics of power spectral density in a comparative example.

FIG. 6 is a graph illustrating an example of frequency characteristics of power spectral density in a comparative example. In this comparative example, the dithering signal Dth is not applied, and the dithering signal generation circuit 270, the adder 250, and the subsequent-stage quantizer 260 are not provided. In the drawing, the vertical axis represents power spectral density (PSD) of the digital signal Dout, and the horizontal axis represents frequency of the digital signal Dout. The dotted line indicates a designed value for each frequency.

As mentioned above, when a direct-current component is input, an unnecessary periodic signal called idle tone occurs in the delta-sigma modulator 200. This idle tone, for example, causes PSD significantly deviating from the designed value to be obtained at a frequency of $10^4$ hertz (Hz).

Figure 7:
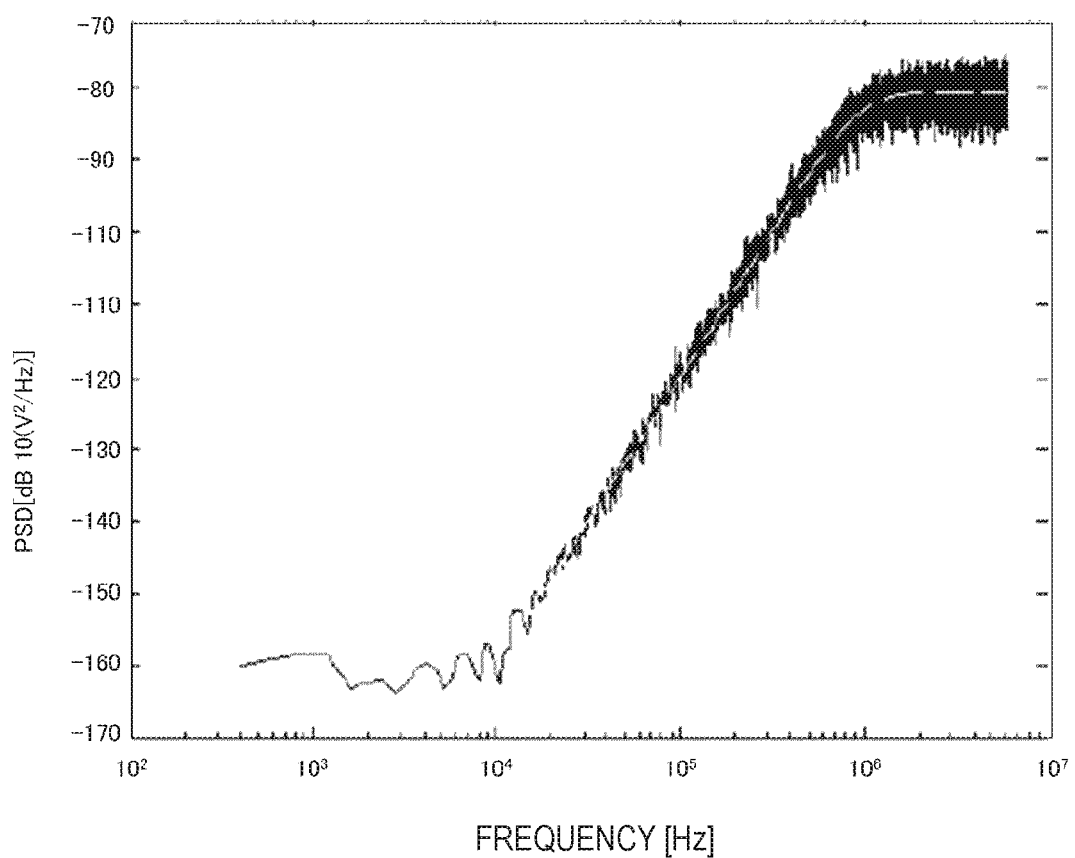
FIG. 7 is a graph illustrating an example of frequency characteristics of power spectral density in the first embodiment of the present technology.

FIG. 7 is a graph illustrating an example of frequency characteristics of power spectral density in the first embodiment of the present technology. In the drawing, the vertical axis represents PSD, and the horizontal axis represents frequency. The dotted line indicates a designed value for each frequency. As compared with FIG. 6, in FIG. 7, the idle tone is suppressed by application of the dithering signal Dth, and frequency characteristics are close to the designed value.

However, application of the dithering signal Dth can suppress an idle tone, but makes the number of bits of the subsequent-stage input signal Din longer. If the subsequent-stage input signal Din is input as it is to the digital-to-analog converter 210, a circuit size of the digital-to-analog converter 210 increases and characteristics deteriorate, as compared with a case of not applying the dithering signal Dth. However, in the delta-sigma modulator 200, the subsequent-stage quantizer 260 performs re-quantization into the number of bits shorter than that at the time of the preceding-stage output; thus, an increase in circuit size of the digital-to-analog converter 210 can be suppressed.

[Operation Example of Delta-Sigma Modulator]

Figure 8:
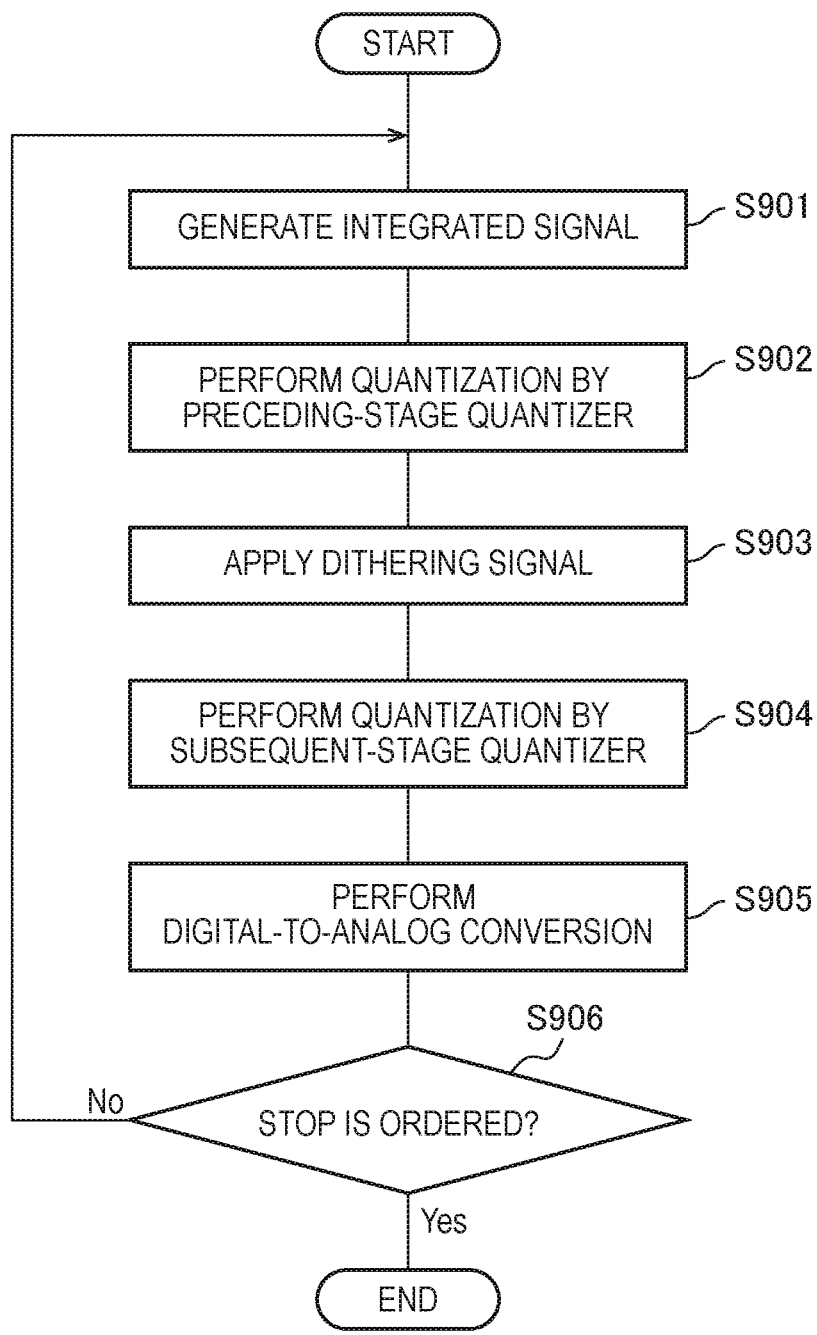
FIG. 8 is a flowchart illustrating an example of operation of the delta-sigma modulator in the first embodiment of the present technology.

FIG. 8 is a flowchart illustrating an example of operation of the delta-sigma modulator 200 in the first embodiment of the present technology. This operation is started when, for example, an analog signal Ain is input.

In the delta-sigma modulator 200, the loop filter 230 generates an integrated signal INT (step S901). Then, in the delta-sigma modulator 200, the preceding-stage quantizer 240 quantizes the integrated signal INT into an M (e.g., 5)-bit preceding-stage output signal Fout (step S902).

The delta-sigma modulator 200 applies a D (e.g., 2)-bit dithering signal Dth to the preceding-stage output signal Fout (step S903), and the subsequent-stage quantizer 260 re-quantizes the resulting signal into an N (e.g., 3)-bit digital signal Dout (step S904).

In the delta-sigma modulator 200, the digital-to-analog converter 210 converts the digital signal Dout into a feedback signal FB (step S905), and the control unit 130 determines whether or not a stop is ordered (step S906). In the case where a stop is not ordered (step S906: No), the delta-sigma modulator 200 repeatedly executes step S901 and the following steps. On the other hand, in the case where a stop is ordered (step S906: Yes), the delta-sigma modulator 200 ends conversion operation.

As described above, according to the first embodiment of the present technology, the subsequent-stage quantizer 260 re-quantizes a signal after application of a dithering signal into a shorter digital signal, and thus can reduce a circuit size of the subsequent digital-to-analog converter 210, as compared with the case of not performing re-quantization. Thus, the delta-sigma modulator 200 can suppress an idle tone effectively.

2. Second Embodiment

In the first embodiment described above, a 2-bit dithering signal Dth of "−2" to "+1" is applied; however, it is difficult for an expected value of this dithering signal Dth to be substantially zero. For example, if respective frequencies of appearance of "−2", "−1", "0", and "+1" are made equivalent, the expected value will be "−0.5", and there is a concern that this value serves as an offset component in the digital signal Dout and signal quality decreases. Therefore, the expected value of the dithering signal Dth is preferably substantially zero. This delta-sigma modulator 200 of a second embodiment is different from the first embodiment in that a dithering signal Dth whose expected value is substantially zero is generated and applied.

Figure 9:
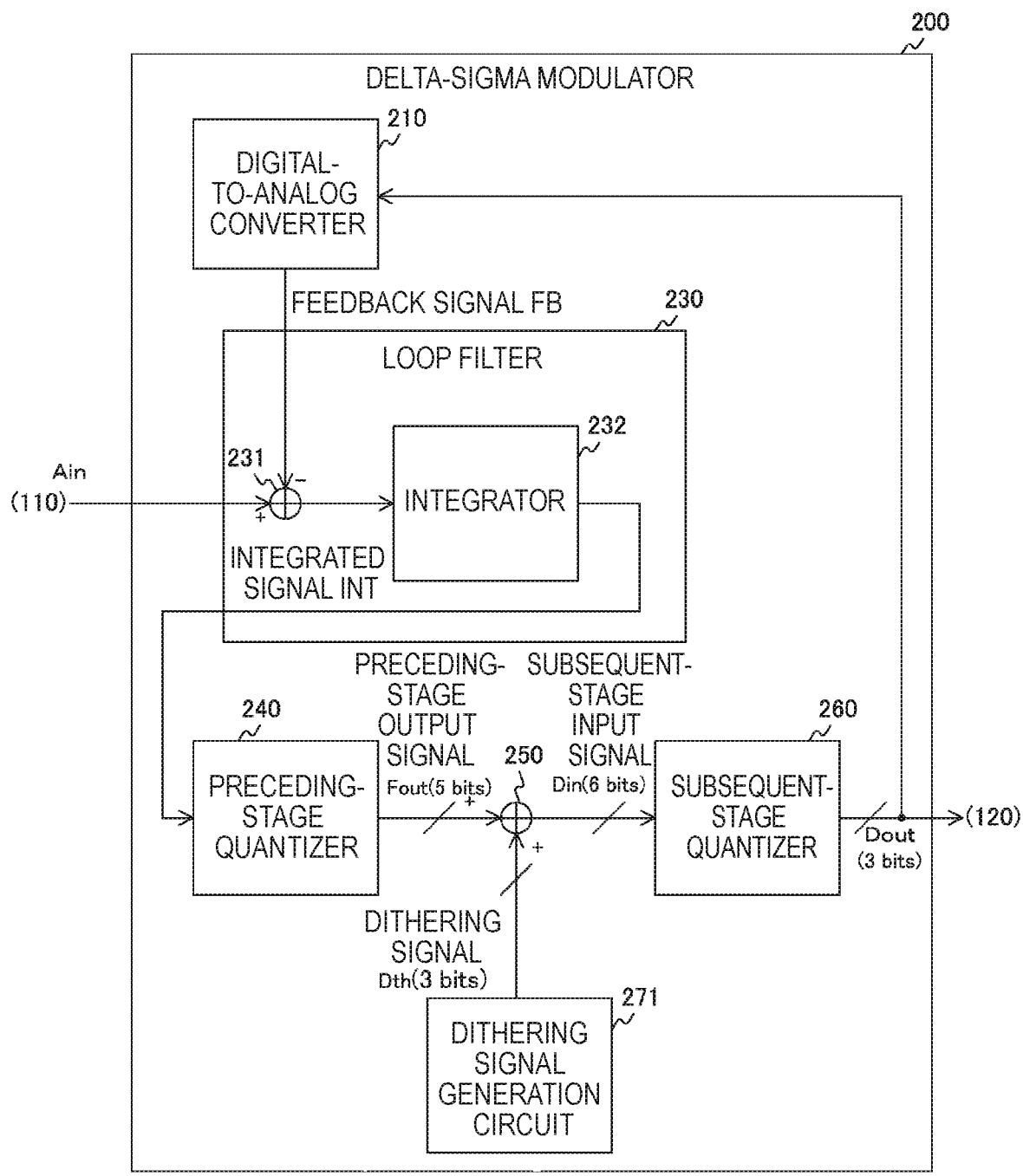
FIG. 9 is a block diagram illustrating a configuration example of a delta-sigma modulator in a second embodiment of the present technology.

FIG. 9 is a block diagram illustrating a configuration example of the delta-sigma modulator 200 in the second embodiment of the present technology. This delta-sigma modulator 200 of the second embodiment is different from the first embodiment in including a dithering signal generation circuit 271 instead of the dithering signal generation circuit 270.

The dithering signal generation circuit 271 is different from the first embodiment in that a signal whose expected value is substantially zero is generated as the dithering signal Dth. This dithering signal generation circuit 271, for example, generates a 3-bit dithering signal Dth of "−2" to "+2". In addition, respective frequencies of appearance of "−2" and "+2" are adjusted to be the same, and respective frequencies of appearance of "−1" and "+1" are also adjusted to be the same. Thus, a weighted average value (i.e., expected value) of each of values that the digital signal Dth can take, obtained by using a frequency of appearance as a weight, is "0".

Figure 10:
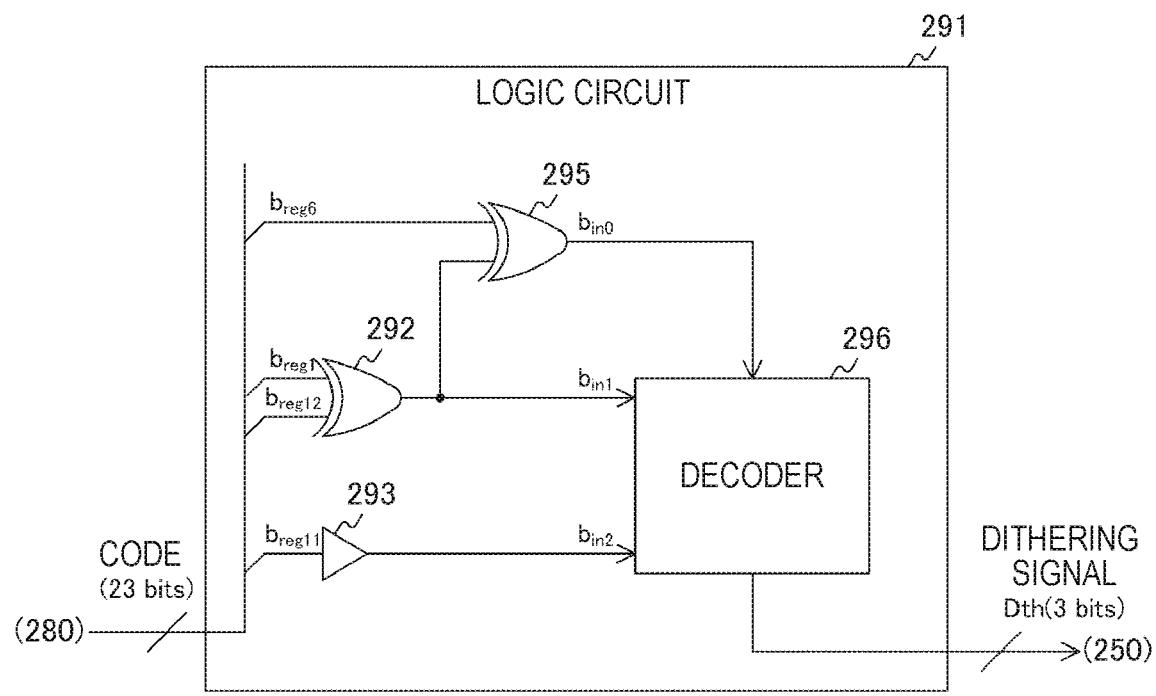
FIG. 10 is a circuit diagram illustrating a configuration example of a logic circuit in the second embodiment of the present technology.

FIG. 10 is a circuit diagram illustrating a configuration example of a logic circuit 291 in the second embodiment of the present technology. This logic circuit 291 is different from the first embodiment in further including a decoder 296 and further including a XOR gate 295.

The XOR gate 292 of the second embodiment inputs the exclusive OR to the decoder 296 as bit $b_{in1}$, and the buffer 293 inputs bit $b_{reg11}$ to the decoder 296 as bit $b_{in2}$.

The XOR gate 295 inputs the exclusive OR of bit $b_{in1}$ from the XOR gate 292 and bit $b_{reg6}$ in the code to the decoder 296 as bit $b_{in0}$. As values of a signal including $b_{in0}$, $b_{in1}$, and $b_{in2}$, uncorrelated random numbers of about 1 million cycles are obtained in a period of the 23-bit code (about 4 million cycles).

The decoder 296 maps an input signal including $b_{in0}$, $b_{in1}$, and $b_{in2}$ to a range of "−2" to "+2", and outputs the resulting signal to the adder 250 as a dithering signal Dth. The adder 250 adds the dithering signal Dth to a preceding-stage output signal Fout.

FIG. 11 illustrates an example of mapping in the second embodiment of the present technology. The decoder 296 converts (maps) an input signal that is "111" in binary number to a dithering signal Dth that is "−1" in decimal number. In addition, "110", "101", "100", "011", "010", "001", and "000" are mapped respectively to "−2", "+1", "0", "−1", "+2", "+1", and "0".

Figure 12:
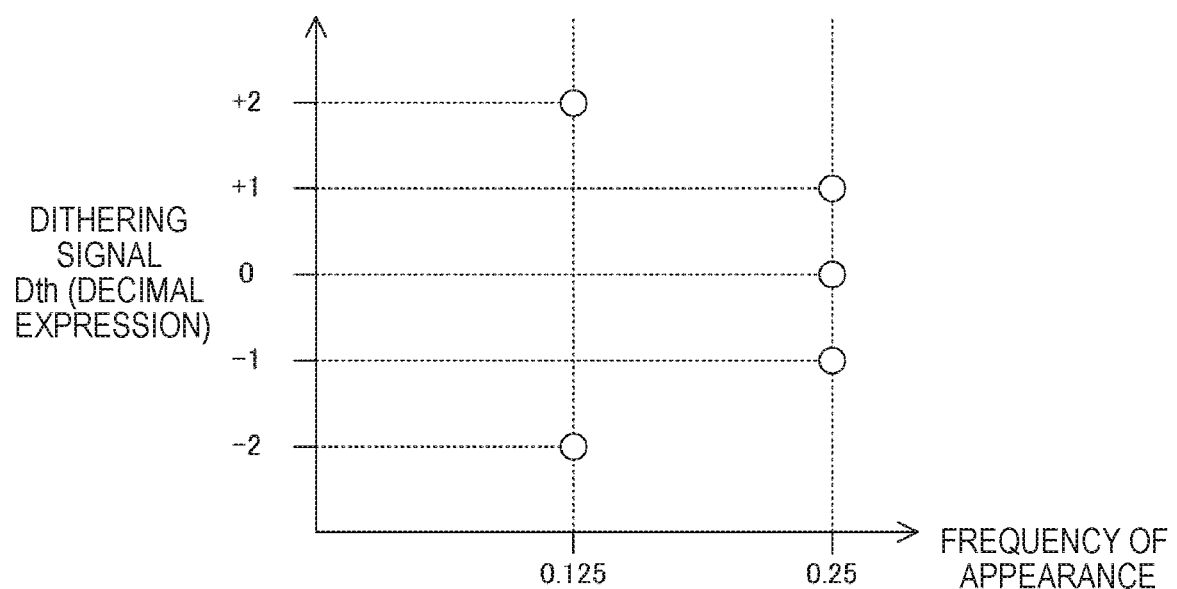
FIG. 12 illustrates an example of frequency of appearance for each value of a dithering signal in the second embodiment of the present technology.

FIG. 12 illustrates an example of frequency of appearance for each value of the dithering signal Dth in the second embodiment of the present technology. In the drawing, the vertical axis is a value of the dithering signal Dth, and the horizontal axis represents a frequency of appearance of each value. For example, frequencies of appearance of "+2" and "−2" are both 0.125, and frequencies of appearance of "4", "0", and "+1" are all 0.25. These settings cause the expected value of the dithering signal Dth to be "0", and can suppress generation of an offset component.

As described above, in the second embodiment of the present technology, a dithering signal whose expected value is substantially zero is applied to a preceding-stage output signal Fout; thus, generation of an offset component can be suppressed.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a Compact Disc (CD), a MiniDisc (MD), and a Digital Versatile Disc (DVD), a memory card, and a Blu-ray disc (registered trademark) can be used.

Note that the effects described in the present specification are not necessarily limited, and any effect described in the present disclosure may be exhibited.

Additionally, the present technology may also be configured as below.

(1)
A delta-sigma modulator including:
a filter configured to integrate a difference between an input analog signal and a feedback signal, and output the integrated difference as an integrated signal;
a preceding-stage quantizer configured to quantize the integrated signal into a digital signal, and output the resulting digital signal as a preceding-stage output signal;
an adder configured to add a predetermined dithering signal to the preceding-stage output signal, and output the resulting signal as a subsequent-stage input signal;
a subsequent-stage quantizer configured to quantize the subsequent-stage input signal into a digital signal of a shorter number of bits than the preceding-stage output signal, and output the resulting digital signal as a subsequent-stage output signal; and
a digital-to-analog converter configured to convert the subsequent-stage output signal into an analog signal, and output the resulting analog signal to the filter as the feedback signal.

(2)
The delta-sigma modulator according to (1), further including:
a dithering signal generation circuit configured to generate the predetermined dithering signal and supply the predetermined dithering signal to the adder.

(3)
The delta-sigma modulator according to (2), in which
the dithering signal generation circuit includes
a linear shift feedback register configured to generate a predetermined code indicating a random number, and
a logic circuit configured to generate the predetermined dithering signal from the predetermined code.

(4)
The delta-sigma modulator according to (2) or (3), in which
the predetermined dithering signal generation circuit generates a signal whose expected value is substantially zero as the predetermined dithering signal.

(5)
The delta-sigma modulator according to any one of (1) to (4), in which
the filter includes
a subtractor configured to compute a difference between the analog signal and the feedback signal, and
an integrator configured to integrate the difference, and output the integrated difference as the integrated signal.

(6)
An electronic device including:
a filter configured to integrate a difference between an input analog signal and a feedback signal, and output the integrated difference as an integrated signal;
a preceding-stage quantizer configured to quantize the integrated signal into a digital signal, and output the resulting digital signal as a preceding-stage output signal;
an adder configured to add a predetermined dithering signal to the preceding-stage output signal, and output the resulting signal as a subsequent-stage input signal;
a subsequent-stage quantizer configured to quantize the subsequent-stage input signal into a digital signal of a shorter number of bits than the preceding-stage output signal, and output the resulting digital signal as a subsequent-stage output signal;
a digital-to-analog converter configured to convert the subsequent-stage output signal into an analog signal, and output the resulting analog signal to the filter as the feedback signal; and
a digital signal processing unit configured to execute predetermined processing on the subsequent-stage output signal.

(7)
A method for controlling a delta-sigma modulator, the method including:
a filtering step of integrating a difference between an input analog signal and a feedback signal, and outputting the integrated difference as an integrated signal;
a preceding-stage quantization step of quantizing the integrated signal into a digital signal, and outputting the resulting digital signal as a preceding-stage output signal;
an addition step of adding a predetermined dithering signal to the preceding-stage output signal, and outputting the resulting signal as a subsequent-stage input signal;
a subsequent-stage quantization step of quantizing the subsequent-stage input signal into a digital signal of a shorter number of bits than the preceding-stage output signal, and outputting the resulting digital signal as a subsequent-stage output signal; and
a digital-to-analog conversion step of converting the subsequent-stage output signal into an analog signal, and outputting the resulting analog signal as the feedback signal.

REFERENCE SIGNS LIST 100 sound device
110 analog signal generation unit 120 digital signal processing unit
130 control unit
140 recording unit
200 delta-sigma modulator
210 digital-to-analog converter
211, 212, 213, 215, 216, 218, 220, 221 resistor
214, 217, 219 switch
222 comparator
230 loop filter
231 subtractor
232 integrator
240 preceding-stage quantizer
250 adder
260 subsequent-stage quantizer
270, 271 dithering signal generation circuit
280 linear feedback shift register
281, 292, 295 exclusive OR (XOR) gate
282 flip-flop
290, 291 logic circuit
293 buffer
296 decoder

The invention claimed is:

1. A delta-sigma modulator, comprising:
a filter configured to:
integrate a difference between an input analog signal and a feedback signal; and
output the integrated difference as an integrated signal;
a preceding-stage quantizer configured to:
quantize the integrated signal into a first digital signal; and
output the first digital signal as a preceding-stage output signal;
an adder configured to:
add a determined dithering signal to the preceding-stage output signal; and
output a resulting signal based on the addition as a subsequent-stage input signal;
a subsequent-stage quantizer configured to:
re-quantize the subsequent-stage input signal into a second digital signal of a shorter number of bits than the preceding-stage output signal; and
output the second digital signal as a subsequent-stage output signal; and
a digital-to-analog converter configured to:
convert the subsequent-stage output signal into a resulting analog signal; and
output the resulting analog signal to the filter as the feedback signal.

2. The delta-sigma modulator according to claim 1, further comprising a dithering signal generation circuit configured to:
generate the determined dithering signal; and
supply the generated determined dithering signal to the adder.

3. The delta-sigma modulator according to claim 2, wherein the dithering signal generation circuit includes:
a linear shift feedback register configured to generate a determined code indicating a random number; and
a logic circuit configured to generate the determined dithering signal from the determined code.

4. The delta-sigma modulator according to claim 2, wherein the dithering signal generation circuit generates a signal whose expected value is substantially zero as the determined dithering signal.

5. The delta-sigma modulator according to claim 1, wherein the filter includes:
a subtractor configured to compute the difference between the input analog signal and the feedback signal; and
an integrator configured to:
integrate the difference; and
output the integrated difference as the integrated signal.

6. The delta-sigma modulator according to claim 1, wherein the re-quantization comprises truncation of a determined digit of the subsequent-stage input signal.

7. An electronic device, comprising:
a filter configured to:
integrate a difference between an input analog signal and a feedback signal; and
output the integrated difference as an integrated signal;
a preceding-stage quantizer configured to:
quantize the integrated signal into a first digital signal; and
output the first digital signal as a preceding-stage output signal;
an adder configured to:
add a determined dithering signal to the preceding-stage output signal; and
output a resulting signal based on the addition as a subsequent-stage input signal;
a subsequent-stage quantizer configured to:
re-quantize the subsequent-stage input signal into a second digital signal of a shorter number of bits than the preceding-stage output signal; and
output the second digital signal as a subsequent-stage output signal;
a digital-to-analog converter configured to:
convert the subsequent-stage output signal into a resulting analog signal; and
output the resulting analog signal to the filter as the feedback signal; and
a digital signal processing unit configured to process the subsequent-stage output signal.

8. A method for controlling a delta-sigma modulator, the method comprising:
integrating a difference between an input analog signal and a feedback signal;
outputting the integrated difference as an integrated signal;
quantizing the integrated signal into a first digital signal;
outputting the first digital signal as a preceding-stage output signal;
adding a determined dithering signal to the preceding-stage output signal;
outputting a resulting signal based on the addition as a subsequent-stage input signal;
re-quantizing the subsequent-stage input signal into a second digital signal of a shorter number of bits than the preceding-stage output signal;
outputting the second digital signal as a subsequent-stage output signal;
converting the subsequent-stage output signal into a resulting analog signal; and
outputting the resulting analog signal as the feedback signal.

* * * * *